(12) United States Patent
Suchy et al.

(10) Patent No.: US 11,223,198 B2
(45) Date of Patent: Jan. 11, 2022

(54) VOLTAGE LIMITER WITH OVERVOLTAGE PROTECTION

(71) Applicant: SALTEK S.R.O., Usti Nad Labem (CZ)

(72) Inventors: Jaromir Suchy, Usti Nad Labem-Skorotice (CZ); Jaroslav Ruzicka, Usti Nad Labem (CZ); Pavel Bocheza, Usti Nad Labem (CZ)

(73) Assignee: SALTEK S.R.O., Usti Nad Labem (CZ)

( * ) Notice: Subject to any disclaimer, the term of this patent is extended or adjusted under 35 U.S.C. 154(b) by 107 days.

(21) Appl. No.: 16/492,110

(22) PCT Filed: Mar. 15, 2018

(86) PCT No.: PCT/IB2018/051751
§ 371 (c)(1),
(2) Date: Sep. 7, 2019

(87) PCT Pub. No.: WO2018/167716
PCT Pub. Date: Sep. 20, 2018

(65) Prior Publication Data
US 2021/0135450 A1    May 6, 2021

(30) Foreign Application Priority Data
Mar. 15, 2017 (CZ) .................. CZ2017-143

(51) Int. Cl.
*H02H 9/04* (2006.01)
*B60M 5/00* (2006.01)
(Continued)

(52) U.S. Cl.
CPC .............. *H02H 9/044* (2013.01); *B60M 5/00* (2013.01); *H01C 7/12* (2013.01); *H01L 23/62* (2013.01); *H01L 25/165* (2013.01); *H02H 9/045* (2013.01)

(58) Field of Classification Search
CPC ........ H02H 9/041; H02H 9/044; H02H 9/045; B60M 5/00; B60M 5/02; H01L 21/52;
(Continued)

(56) References Cited

U.S. PATENT DOCUMENTS

| 2004/0257742 A1 | 12/2004 | Zeller et al. |
| 2015/0223368 A1 | 8/2015 | Pippert et al. |
| 2016/0276821 A1 | 9/2016 | Politis et al. |

FOREIGN PATENT DOCUMENTS

| DE | 755291 C | 10/1953 |
| DE | 4332888 A1 | 3/1995 |

(Continued)

OTHER PUBLICATIONS

International Search Report (dated Jun. 15, 2018) for corresponding International App PCT/IB2018/051751.
(Continued)

*Primary Examiner* — Kevin J Comber
(74) *Attorney, Agent, or Firm* — WRB-IP LLP

(57) ABSTRACT

The submitted voltage limiter consists of the insulating shell (26), closed from the top by the electrically and thermally conductive first contact plate (2) provided with the first connecting point (1) and from the bottom by the electrically and thermally conductive second contact plate (10) provided with the second connecting point (9). The embodiment of the two triggering semiconductor elements (5, 13) oriented in opposing directions and the protection member (17) connected to it in parallel, located between the two inner
(Continued)

Figure 1:
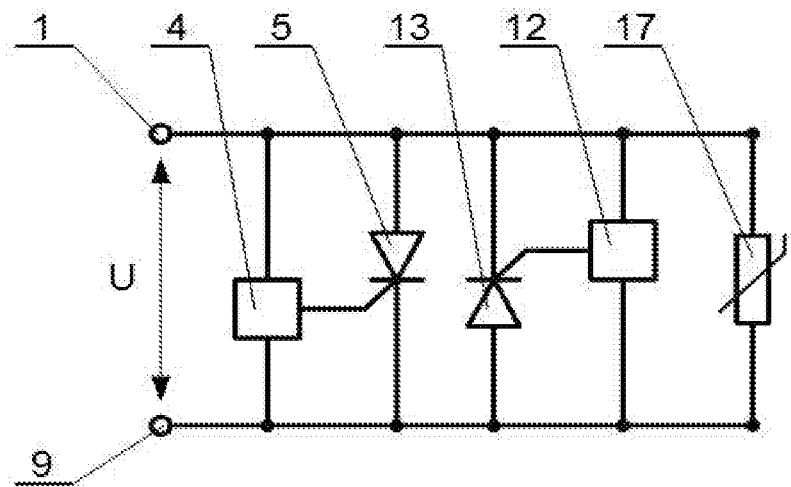

plates (3, 11), is located inside the insulating shell (26). The semiconductor elements (5, 13) are simultaneously interconnected with the electronic control device and connecting points (1, 9). The limiter is equipped with compressive construction to provide clamping and electrical interconnection of individual parts. The first triggering semiconductor element (5) is located between the thermally and electrically conductive first inner plate (3), which is in contact with its cathode (7) and the first contact plate (2), which is in contact with its anode (6). The second triggering semiconductor element (13) is located between the thermally and electrically conductive second inner plate (11), which is in contact with its cathode (15) and the second contact plate (10), which is in contact with its anode (14). The electronic control device may be located outside or inside the insulating shell (26) and consists of the first control device (4) interconnected with the control electrode (8) of the first triggering semiconductor element (5), the first contact plate (2) and the first inner plate (3) and interconnected with the control electrode (16) of the second triggering semiconductor element (13), with the second contact plate (10) and the second inner plate (11) from the second control device (12).

10 Claims, 2 Drawing Sheets

(51) Int. Cl.
  *H01C 7/12* (2006.01)
  *H01L 23/62* (2006.01)
  *H01L 25/16* (2006.01)

(58) Field of Classification Search
  CPC ..... H01L 23/62; H01L 25/165; H01L 25/117; H01C 7/10; H01C 7/12
  USPC ........................................................ 361/91.2
  See application file for complete search history.

(56) References Cited

FOREIGN PATENT DOCUMENTS

| DE | 102009043229 A1 | 3/2011 |
|---|---|---|
| EP | 0462694 A2 | 12/1991 |
| EP | 1855365 A1 | 11/2007 |

OTHER PUBLICATIONS

Bernhard Richter: Overvoltage protection concept for DC railway systems, 1-10 Journal of Electrostatics, vol. 65, Issues 5-6, May 2007, pp. 356-362, Available online from Nov. 21, 2006 https://www.sciencedirect.com/search/advanced?tak=overvoltage%20protection%20concept%20for%20railway%20systems&show=25&sortby=relevance.

VOLTAGE LIMITER WITH OVERVOLTAGE PROTECTION

TECHNOLOGICAL BACKGROUND

The technical solution relates to a protection device which prevents the occurrence of impermissible high contact voltage and reduces overvoltage, particularly in railways, i.e., in passenger railway stations and in sectioning posts.

The protection device protects from impermissible voltage caused by the rail potential during operation and short circuits. It provides a transient connection between the traction return circuit and the grounding of the traction systems over the time the permissible voltage value is exceeded. Hence, it protects persons who can come into contact with these parts.

Current State of Technology

Legislation amendments related to devices protecting from contact voltage in electric traction and surge arresters for electrical railway equipment have completely changed the requirements for protection devices. Some protection devices either fail to meet the requirements partially or completely with their parameters, or they are technically too complicated, i.e., costly.

There is a known solution described in document US2004257742A1 "Voltage limiter", which describes a design of a varistor connected to a triggering element consisting of two antiparallel thyristors and a control device which monitors the difference potential and dangerous contact voltage and eliminates dangerous voltage by activation of the relevant thyristor. The document further describes the design of the protection device; it particularly relates to the connection of individual sub-systems into one unit. The construction is arranged asymmetrically with the protection element, the varistor being located at the top, the control device in the middle and both thyristors at the bottom, between two plates. The external plate is in contact with the anode of the first thyristor and, at the same time, with the cathode of the second thyristor, whereas the cathode of the first thyristor and the anode of the second thyristor are in contact with the inner plate. The inner plate is located inside a housing, insulated from the surrounding environment by a shell and inner insulation, hence it is unable to remove the same amount of heat as the external plate. The disadvantage of this solution is uneven anode cooling of one of the thyristors as a result of the asymmetric construction. This results in uneven thyristor loading, so it is necessary to choose higher thyristor parameters to achieve the required parameters even in worse heat removal.

Another known technical solution described in the patent literature, document EP1855365 A1 "Overvoltage protection device module and method for forming the same", contains a varistor, to which two thyristors and a triggering circuit are connected in antiparallel. The triggering circuit monitors the occurrence of the difference potential and dangerous contact voltage and eliminates dangerous voltage by activating the relevant thyristor. The document further describes the design of the protection device; it particularly relates to the connection of individual sub-systems into one unit and their location on the mounting plate. The device partially eliminates the disadvantages of the prior technical solutions; however, its disadvantages are a large requirement for space and the complexity of the construction. There are also pertaining disadvantages of the solution according to document US2004257742A1 with uneven cooling of both thyristor anodes.

Another example of the technical solution protected by a utility model is document CZ22115 "Power semiconductor overvoltage limiter". This document describes one of the possible solutions of an antiparallel design of two identical power semiconductor blocks containing a circuit interconnection of some elements such as thyristors, triggering diodes, Zener diodes, varistor, resistors and capacitors. The specific design of the mechanical arrangement of individual elements of the limiter is not specified.

Another document known from patent literature—DE4217234 "Voltage limiting circuit for current cut-out electronic extinction device—has a parallel circuit across the extinction capacitor limiting the capacitor voltage using nonlinear resistance and GTO thyristor" the design of which features a thyristor and varistor in an SiC embodiment. This technical solution relates only to the electrical interconnection of elements which does not comply with the current state of technology, especially because SiC varistors do not have sufficient resistance to impulses nor are they produced or used.

Further possible examples are documents WO9623343 "Overvoltage protector" and WO 2011098359 "Surge-limiting device for direct current networks". The designs specified in these documents comprise some identical elements such as thyristors, varistors and diodes; however, the documents describe only the electrical interconnection of these elements, and not with their mechanical arrangement.

Of further patent literature we should mention some documents describing the construction of a semiconductor device housing, e.g., document US2013062749 "Semiconductor module", resp. document EP0159797A2 "A semiconductor device and the process of producing the same field of the invention". They relate to the construction of a semiconductor module containing a semiconductor chip which is in contact with the first and second cylindrical electrode plate, whereas both plates are pushed against each other by the force of a thread or screws. The disadvantage of both solutions is that they do not contain any protection element against impulse overvoltage and a control circuit is missing.

Another example of a technical solution is the construction described in document CZ299882 "Separating member" specified particularly for voltage-dependent earthing of buried insulated metal constructions. The semiconductor device consists of a common base on one side on which at least two antiparallel-oriented columns of silica plates are located and on the other side by a sheet metal terminal. The columns are clamped by compressive construction studs. The disadvantage of this solution is that it does not contain any protection element against pulse overvoltage or a control circuit which would provide for proper functioning.

Basis of the Technical Solution

The above-stated disadvantages are eliminated by the submitted voltage limiter with overvoltage protection. It comprises a cylindrical insulating shell, closed from the top by the electrically and thermally conductive first contact plate provided with the first connecting point and by the electrically and thermally conductive second contact plate provided with the second connecting point from the bottom. The insulating shell houses a design of two triggering semiconductor elements oriented in opposing directions and a protection member connected in parallel, consisting of one or more varistors connected in parallel. The protection element is located between the two inner plates. The triggering semiconductor elements are connected via auxiliary lines to an electronic control device and connecting points. The limiter is equipped with a compressive construction to provide clamping and electrical interconnection of the parts. The principle of the new solution is that the first triggering semiconductor element is located between the first inner plate, which is in contact with its cathode and the first contact plate, which is in contact with its anode. The second triggering semiconductor element is located between the second inner plate, which is in contact with its cathode, and the second contact plate, which is in contact with its anode. The first contact plate and the second inner plate are thermally and electrically conductive and are pushed against each other via the first triggering semiconductor element, the first inner plate and the protection element by at least the first two thrust members located perpendicularly to the (X)-axis, electrically insulated from the first inner plate by the first insulating shells. Simultaneously, the first contact plate and second inner plate are electrically interconnected. The second contact plate and the first inner plate are thermally and electrically conductive and are pushed against each other via the second triggering semiconductor element, the second inner plate and the protection element by at least the second two thrust members located perpendicularly to the (X)-axis, electrically insulated from the second inner plate by the second insulating shells. At the same time, the second contact plate and the first inner plate are electrically interconnected. The first and second thrust elements are electrically conductive.

In one possible design, the electronic control device is located outside the insulating shell and consists of the first and second control device. The first control device is interconnected with the control electrode of the first triggering semiconductor element, with the first contact plate and the first inner plate via the auxiliary lines. The second control device is interconnected with the control electrode of the second triggering semiconductor element, with the second contact plate and the second inner plate via the auxiliary lines. The electronic control device switches one of the triggering elements to limit impermissible voltage in the event of the occurrence of impermissible voltage between the connecting points, depending on its polarity.

In the second possible design, the electronic control device is located inside the insulating shell and consists of the first and second control device. In this case, the first inner plate consists of the first flat plate and the first additional plate sitting on its upper surface and having a reverse U-shaped crosscut. The first control device is located in the formed first cavity, and it is interconnected via the first interconnecting pin passing through the opening in the first additional plate, interconnected with the control electrode of the first triggering semiconductor element, located between the first additional plate and the first contact plate, and it is interconnected with the first contact plate and first additional plate via the auxiliary lines. The second inner plate consists of the second flat plate and the second additional plate sitting on its bottom surface and having a reverse U-shaped crosscut. The second control device located in the formed second cavity is interconnected via the second interconnecting pin passing through the opening in the second additional plate interconnected with the control electrode of the second triggering semiconductor element located between the second additional plate and the second contact plate, and it is interconnected with the second contact plate and second additional plate via the auxiliary lines.

The first and second triggering semiconductor element consist of encapsulated thyristors or semiconductor chips.

The insulating shell advantageously comprises sealing and insulating material filling the space between the surface and other parts of the limiter.

In one possible embodiment, the first and second thrust elements consist of studs and nuts and are electrically conductive.

In the advantageous embodiment, the protection element is located directly on the X-axis of the insulating shell and the first and second triggering semiconductor elements are located symmetrically to each other to the X-axis.

It is also advantageous if the first contact plate, second contact plate, simple and compound first inner plate and the simple and compound second inner plate are cylindrical.

The above stated apparently shows that the anodes of the triggering semiconductor elements in the specified arrangement are both in contact with the outer contact plates, i.e., with the first contact plate, respectively with the second contact plate, which ensures even cooling, i.e., identical loading of both anodes of the triggering semiconductor elements. In the advantageous design, the arrangement is symmetric, with the triggering semiconductor elements located at the top and at the bottom and the protection element, usually a varistor, being located in the middle on the X-axis, whereas the simple or compound first inner plate and simple or compound second inner plate and the electrically conductive thrust elements interconnect the protection element with the connecting points. Apart from the above-stated equal cooling of the anodes, the submitted solution simplifies the construction, and it requires a lower number of parts and consequently lower costs.

The voltage limiter responds to all slow and fast, short and long DC and AC pulses. The protection element varistor responds to the occurrence of overvoltage pulse always as the first, and it protects both triggering semiconductor elements as well as the device, sensors and measuring appliances from the overvoltage effects generated as a result of atmospheric and triggering phenomena. An impulse lasting a longer time would, however, result in destruction of the varistor, in this case, some of the triggering semiconductor elements will be activated with a delay of approx. 1 ms. The electronic control device permanently monitoring the occurrence of impermissible voltage between the connecting points and depending on the polarity triggers one of the triggering semiconductor elements and in this way limits impermissible voltage. The electronic control device is passive, it does not require any auxiliary power supply. The triggering semiconductor elements have a low power loss and they can lead a significant current on a continuous basis, resp. over a long time. If the current passing through the triggering semiconductor element drops below the value of the latching current, the limiter will open and the high impedance condition renews.

DRAWING EXPLANATION

The voltage limiter with overvoltage protection according to the submitted solution will be described below using the attached drawings. For a better understanding, FIG. 1 shows the wiring of the voltage limiter with overvoltage protection in a bipolar design, which, however, is not the subject of the protection.

Figure 2:
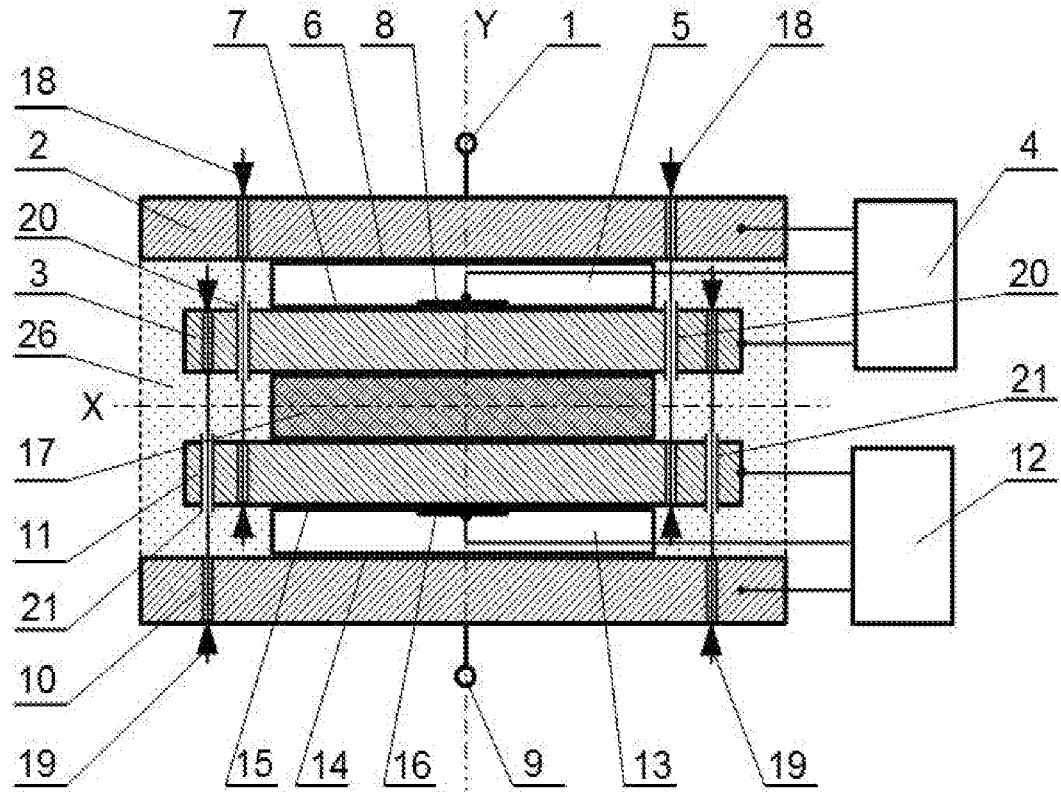
Figure 3:
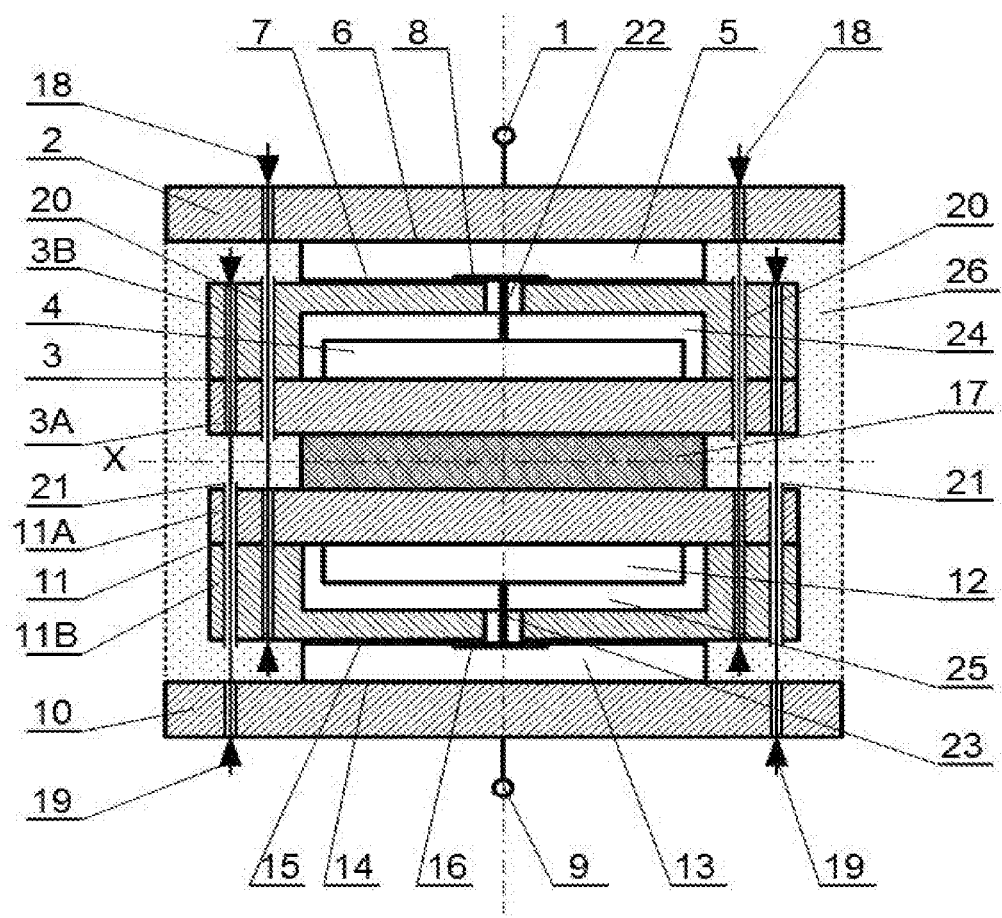

FIG. 2 shows a diagram of one possible arrangement of the limiter, while the second possible arrangement is shown in FIG. 3.

Examples of the Technical Solution'S Implementation

The voltage limiter with overvoltage protection in a bipolar design according to FIG. 1 consists of the design of two triggering semiconductor elements oriented in opposing directions, i.e., the first triggering semiconductor element 5 and the second triggering semiconductor element 13 and the protection member 17 connected to it in parallel, consisting here of a varistor. To increase impulse resistance, more varistors connected in parallel can be used. The figure also shows the electronic control device, consisting of the first control device 4 and the second control device 12, used for actuating the triggering semiconductor elements.

FIG. 2 shows the first possible arrangement of the voltage limiter with overvoltage protection in a bipolar design. The limiter comprises the cylindrical insulating shell 26, closed from the top by the electrically and thermally conductive first contact plate 2, equipped with the first connecting point 1. The bottom part of the insulating shell 26 is closed with the second contact plate 10 equipped with the second connecting point 9. The first contact plate 2 and the second contact plate 10 are electrically and thermally conductive. The triggering semiconductor elements, i.e., the first triggering semiconductor element 5 and the second triggering semiconductor element 13, and the protection member 17 according to FIG. 1, connected to them in parallel, are located inside the insulating shell 26. The protection element 17 is located here between the two inner plates, i.e., between the first inner plate 3 and the second inner plate 11. The first triggering semiconductor element 5 and the second triggering semiconductor element 13 can consist of encapsulated thyristors or semiconductor chips.

The first triggering semiconductor element 5 is located between the first inner plate 3, which is in contact with its cathode 7 and the first contact plate 2, which is in contact with its anode 6. The second triggering semiconductor element 13 is located between the second inner plate 11, which is in contact with its cathode 15 and the second contact plate 10, which is in contact with its anode 14. The first inner plate 3 and the second inner plate 11 are thermally and electrically conductive. The first contact plate 2 and the second inner plate 11 are pushed against each other via the first triggering semiconductor element 5, the first inner plate 3 and the protection element 17 by at least the first two electrically conductive thrust members 18 located vertically to the X-axis, electrically insulated from the first inner plate 3 by the first insulating shells 20 whereas, at the same time, the first contact plate 2 and the second inner plate 11 are electrically bonded by them. By analogy, the second contact plate 10 and the first inner plate 3 are both pushed against each other via the second triggering semiconductor element 13, the second inner plate 11 and the protection element 17 by at least the second two electrically conductive thrust members 19 located vertically to the X-axis, electrically insulated from the second inner plate 11 by the second insulating shells 21 whereas the second contact plate 10 and the first inner plate 3 are at the same time electrically bonded by them. The first thrust members 18 and the second thrust members 19 advantageously form a compressive construction for mutual clamping and, at the same time, they provide electrical bonding with the relevant parts of the limiter.

The triggering semiconductor elements 5 and 13 are interconnected via auxiliary lines with the electronic control device. In the example of the embodiment according to FIG. 2, the electronic control device is located outside the insulating shell 26 and consists of two parts, i.e., the first control device 4 interconnected with the control electrode 8 of the first triggering semiconductor element 5, with the first contact plate 2 and the first inner plate 3 and of the second control device 12, interconnected with the control electrode 16 of the second triggering semiconductor element 13, with the second contact plate 10 and with the second inner plate 11. The control devices 4 and 12 located outside the voltage limiter can be joined into one unit which can be situated anywhere in a suitable place, whereas there are more technically advantageous options. The surface of the insulating shell 26 consists of a sealing and insulating compound. In the advantageous model, the voltage limiter assembly is inserted into a mould and filled with a sealing and insulating compound under reduced pressure, where the compound fills in the space between the surface of the insulating shell and other parts of the limiter. The housing is hermetically sealed during this process. There is a large number of sealing compounds which can be used; polyurethane, silicone and epoxy sealing compounds can be used advantageously.

The second possible embodiment of the limiter is shown in FIG. 3. Its solution differs, since the electronic control device is located inside the limiter and again, it consists of the first control device 4 and the second control device 12. For this reason, the first inner plate 3 is separated and consists of the first flat plate 3A and the first additional plate 3B sitting on its upper surface and having a reverse U-shaped crosscut. The first control device 4 is located in the formed first cavity 24. The first control device 4 is connected across the first interconnecting pin 22 passing through the opening in the first additional plate 3B interconnected with the control electrode 8 of the first triggering semiconductor element 5 located between the first additional plate 3B and the first contact plate 2. The first control device 4 is interconnected to the first connecting point 1 and the second connecting point 9 via auxiliary lines, advantageously via the first flat plate 3A and the second flat plate 11A. This solution, together with the location of the electronic control device in the cavity, brings simplification and a compact construction and the possibility of simple encapsulation. By analogy, the second inner plate 11 is also separated and consists of the second flat plate 11A and the second additional plate 11B with a U-shaped crosscut sitting on its bottom surface.

The second control device 12 is located in the formed second cavity 25 and is interconnected via the second interconnecting pin 23 passing through the upper surface of the second additional plate 11B with the control electrode 16 of the second triggering semiconductor element 13, which is located between the second additional plate 11B and the second contact plate 10. The second control device 12 is interconnected with the first connecting point 1 and the second connecting point 9 via the auxiliary lines, advantageously through the first flat plate 3A and the second flat plate 11A.

By analogy, as in the arrangement according to FIG. 2, the first thrust members 18 and the second thrust members 19 are electrically conductive and, advantageously, they form a compressive construction for mutual clamping and, at the same time, an electrically conductive interconnection of the respective parts of the limiter. Similarly as in the arrangement according to FIG. 2, both the first thrust members 18 are electrically insulated from the first additional plate 3B via the first insulating shells 20 and the second thrust members 19 are electrically insulated from the second additional plate 11B via the second insulating shells 21.

In the advantageous model, the first insulating shells 20 and the second insulating shells 21 are formed directly by a sealing and insulating compound.

In both examples of the embodiment the first thrust members 18 and the second thrust members 19 are executed by electrically conductive studs. The protection element 17 was located here directly in the X-axis of the insulating shell 26 and the first triggering semiconductor element 5 and the second triggering semiconductor element 13 were located symmetrically to each other towards the X-axis.

The construction symmetry guarantees that the anodes 7 and 14 of the triggering semiconductor elements 5, 13 are both in contact with the outer contact plates, i.e., with the first contact 2 plate, respectively with the second contact plate 10, as a result of which equal cooling is ensured, and accordingly, identical loading of both anodes of the triggering semiconductor elements. In the advantageous model, the electrically conductive thrust members 18 and 19 provide mechanical clamping and, at the same time, electrically interconnect the individual parts of the voltage limiter. Apart from the stated equal anode cooling, the submitted solution simplifies the construction, requires a lower number of parts and consequently lower costs.

It is advantageous in the production process if the first contact plate 2, the second contact plate 10, the simple and compound first inner plates 3 respectively 3A, 3B and the simple and compound second inner plates 11 respectively 11A, 11B are cylindrical.

The voltage limiter is usually connected via its one connecting point to the protected device and to the protection ground conductor via the second connecting point. The protected device connects to the voltage limiter with overvoltage protection by means of the first connecting point 1 and the second connecting point 9, usually formed by terminals, screws, or studs with nuts.

The voltage limiter responds to all slow and fast, short and long DC and AC pulses. In case of the occurrence of impermissible voltage between the first connecting point 1 and the second connecting point 9 this voltage is led across the first thrust members 18 and second thrust members 19 and across the first inner plate 3 and the second inner plate 11, to the protection element 17 and, at the same time, to the first control device 4 and the second control device 12 via the auxiliary lines. The protection element 17 responds first and limits the voltage in order to prevent damage to the first triggering semiconductor element 5 or the second triggering semiconductor element 13, or any control devices 4 or 12.

Should the impermissible voltage have positive polarity and last more than 1 ms, the first control device 4 responds and triggers the first triggering semiconductor element 5 through the control electrode 8 of the first triggering semiconductor element 5 and limits the impermissible voltage to the permitted threshold. The triggering semiconductor elements have a low power loss and can permanently lead a significant volume of current, resp. over a long time. If the current passing through the triggering semiconductor element drops below the value of the latching current, the semiconductor element opens and the high impedance condition renews.

Should the impermissible voltage have negative polarity and last longer than 1 ms, then, by analogy, the second control device 12 responds and activates the second triggering semiconductor element 13 via the control electrode 16 of the second triggering semiconductor element 13 and limits the impermissible voltage to the permitted threshold.

It should be noted that the time of the delayed response of the control device of 1 ms only represents an indicative value. This value and other technical parameters of the voltage limiter, such as the size of the impermissible voltage and others, vary according to the requirements identified in national regulations.

Application in Industry

The design of the voltage limiter with overvoltage protection according to this solution can be used where it is necessary to protect persons, instruments, machinery and metal constructions against dangerous contact voltage, overvoltage and/or protect against stray currents effects.

The voltage limiter protects against impermissible voltage caused by the rail potential in operation and short-circuits, it levels the potential on the device, as a result of which it limits possible contact voltage. It is connected between the return circuit and the ground conductor, particularly in passenger railway stations or in sectioning posts. It provides a transient connection of the return circuit with the traction system grounding over the time the permissible voltage value is exceeded. Hence, it protects persons who can come into contact with these parts.

The overvoltage protection connected in parallel effectively eliminates high-impulse overvoltage induced in case of lightning strike of traction systems or railroad devices, or occurring during operation.

The invention claimed is:

1. A voltage limiter with overvoltage protection, comprising an insulating shell, closed from a top of the insulating shell by an electrically and thermally conductive first contact plate provided with a first connecting point and from a bottom of the insulating shell by an electrically and thermally conductive second contact plate provided with a second connecting point, wherein first and second triggering semiconductor elements oriented in opposing directions are located inside the insulating shell and a protection member is connected in parallel to the first and second triggering semiconductor elements, the protection member comprising one or more varistors connected in parallel, wherein the protection element is located between a thermally and electrically conductive first inner plate and a thermally and electrically conductive second inner plate, wherein the semiconductor elements are simultaneously interconnected with an electronic control device and connecting points via auxiliary lines, and wherein the voltage limiter is equipped with a compressive construction for mutual clamping and electrical interconnection of individual parts comprising the first triggering semiconductor element located between the thermally and electrically conductive first inner plate, which is in contact with a cathode of the first triggering semiconductor element, and the thermally and electrically conductive first contact plate, which is in contact with an anode of the first triggering semiconductor element, and the second triggering semiconductor element located between the thermally and electrically conductive second inner plate, which is in contact with a cathode of the second triggering semiconductor element, and the thermally and electrically conductive second contact plate, which is in contact with an anode of the second triggering semiconductor element, wherein the first contact plate and the second inner plate are pushed against each other via the first triggering semiconductor element, the first inner plate and the protection element at least by two electrically conductive first thrust members located vertically to an X-axis, electrically insulated from the first inner plate by first insulating shells, wherein the first contact plate and the second inner plate are simultaneously electrically interconnected, and the second contact plate and the first inner plate are pushed against each other via the second triggering semiconductor element, the second inner plate and the protection element at least by two electrically conductive second thrust members located vertically to the X-axis, electrically insulated from the second inner plate by second insulating shells, wherein the second contact plate and the first inner plate are simultaneously electrically bonded.

2. The voltage limiter according to claim 1, wherein the electronic control device is located outside the insulating shell, the electronic control device comprising a first control device interconnected with a control electrode of the first triggering semiconductor element, the first contact plate and the first inner plate and a second control device interconnected with a control electrode of the second triggering semiconductor element, the second contact plate and the second inner plate.

3. The voltage limiter according to claim 2, wherein the first triggering semiconductor element and the second triggering semiconductor element comprise encapsulated thyristors.

4. The voltage limiter according to claim 2, wherein the first triggering semiconductor element and the second triggering semiconductor element comprise semiconductor chips.

5. The voltage limiter according to claim 2, comprising sealing and insulating compound filling in a space inside the insulating shell.

6. The voltage limiter according to claim 2, wherein the first thrust members and the second thrust members comprise studs and nuts.

7. The voltage limiter according to claim 2, wherein the protection element is located directly on the X-axis of the insulating shell and the first triggering semiconductor element and the second triggering semiconductor element are located symmetrically towards the X-axis.

8. The voltage limiter according to claim 2, wherein the first contact plate, second contact plate, the first inner plate and the second inner plate are cylindrical in shape.

9. The voltage limiter according to claim 2, wherein the first control device and the second control device form one unit.

10. The voltage limiter according to claim 1, wherein the electronic control device is located inside the insulating shell, the electronic control device comprising a first control device and a second control device, and the first inner plate comprising a first flat plate and a first additional plate sitting on an upper surface of the first flat plate, with a reversed U-shaped crosscut, wherein the first control device, located in a formed first cavity, is interconnected via a first interconnecting pin passing through an opening in the first additional plate with a control electrode of the first triggering semiconductor element, located between the first additional plate and the first contact plate, and the first control device is interconnected via the auxiliary lines with the first contact plate and the first additional plate, and the second inner plate comprising a second flat plate and a second additional plate with a U-shaped crosscut sitting on a bottom surface of the second flat plate, wherein the second control device, located in a formed second cavity, is interconnected with a control electrode of the second triggering semiconductor element, located between the second additional plate and the second contact plate, via a second interconnecting pin passing through an opening in the second additional plate, and the second control device is interconnected with the second contact plate and the second additional plate via the auxiliary lines.

* * * * *